US010260705B2

(12) United States Patent
Mertens et al.

(10) Patent No.: US 10,260,705 B2
(45) Date of Patent: Apr. 16, 2019

(54) LED LIGHTING MODULE WITH HEAT SINK AND A METHOD OF REPLACING AN LED MODULE

(71) Applicant: KONINKLIJKE PHILIPS N.V., Eindhoven (NL)

(72) Inventors: Jürgen Gerhard Mertens, Aachen (DE); Astrid Marchewka, Aachen (DE); Ralph Hubert Peters, Aachen (DE); Benno Spinger, Aachen (DE); Georg Friedrich Alfons Henninger, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 57 days.

(21) Appl. No.: 15/562,800

(22) PCT Filed: Mar. 31, 2016

(86) PCT No.: PCT/EP2016/057018
§ 371 (c)(1),
(2) Date: Sep. 28, 2017

(87) PCT Pub. No.: WO2016/156463
PCT Pub. Date: Oct. 6, 2016

(65) Prior Publication Data

US 2018/0283644 A1 Oct. 4, 2018

(30) Foreign Application Priority Data

Mar. 31, 2015 (EP) .................................... 15161967

(51) Int. Cl.
*F21S 41/19* (2018.01)
*B60Q 1/00* (2006.01)
(Continued)

(52) U.S. Cl.
CPC ............. *F21S 45/47* (2018.01); *F21S 41/147* (2018.01); *F21S 41/192* (2018.01); *F21S 45/49* (2018.01);
(Continued)

(58) Field of Classification Search
CPC combination set(s) only.
See application file for complete search history.

(56) References Cited

U.S. PATENT DOCUMENTS

2011/0019409 A1 1/2011 Wronski
2012/0293652 A1 11/2012 Farmer
(Continued)

FOREIGN PATENT DOCUMENTS

JP 2011181418 A 9/2011
WO 2010044011 A1 4/2010
(Continued)

OTHER PUBLICATIONS

EPO as ISA, "International Search Report and Written Opinion" dated Jun. 27, 2016 from International Application No. PCT/EP2016/057018, filed Mar. 31, 2016, 13 pages.
(Continued)

*Primary Examiner* — Evan P Dzierzynski

(57) ABSTRACT

An LED module combines a heat sink portion and an LED arrangement. The heat sink portion is a first part of a multiple part heat sink having at least this first part and a second part. The heat sink portion is not sufficient alone to provide the required cooling for the operation of the LED arrangement so it can be small and low cost. A user can simply replace the LED module as a single unit, without the significant waste and cost of disposing of the full heat sink.

14 Claims, 3 Drawing Sheets

(51) Int. Cl.
*F21S 45/47* (2018.01)
*F21S 45/49* (2018.01)
*F21S 41/147* (2018.01)
*F21V 19/04* (2006.01)
*F21V 29/71* (2015.01)
*F21V 29/76* (2015.01)
*F21V 17/00* (2006.01)
*F21Y 115/10* (2016.01)

(52) U.S. Cl.
CPC .......... *F21V 17/002* (2013.01); *F21V 19/045* (2013.01); *F21V 29/713* (2015.01); *F21V 29/763* (2015.01); *F21Y 2115/10* (2016.08)

(56) References Cited

U.S. PATENT DOCUMENTS

2013/0215632 A1* 8/2013 Jackl ..................... F21S 41/192
362/514
2013/0335970 A1* 12/2013 Jokelainen ............ F21V 29/713
362/249.05
2013/0341670 A1* 12/2013 Matsunaga ........... H01L 33/644
257/99
2015/0260390 A1* 9/2015 Bretschneider ..... F21V 19/0055
362/294
2018/0252383 A1* 9/2018 Stefura ................. F21V 31/005

FOREIGN PATENT DOCUMENTS

WO 2012048351 A1 4/2012
WO 2014083122 A1 6/2014

OTHER PUBLICATIONS

Extended European Search Report dated Oct. 5, 2015 from European Patent Application No. 15161967.3 filed Mar. 31, 2015, 7 pages.

* cited by examiner

LED LIGHTING MODULE WITH HEAT SINK AND A METHOD OF REPLACING AN LED MODULE

CROSS-REFERENCE TO RELATED APPLICATIONS

The present application is a § 371 application of International Application No. PCT/EP2016/057018 filed on Mar. 31, 2016 and titled "LED LIGHTING MODULE WITH HEAT SINK AND A METHOD OF REPLACING AN LED MODULE," which claims the benefit of European Patent Application No. 15161967.3 filed on Mar. 31, 2015. International Application No. PCT/EP2016/057018 and European Patent Application No. 15161967.3 are incorporated herein.

FIELD OF THE INVENTION

The present invention relates to an LED module which includes a heat sink.

BACKGROUND OF THE INVENTION

Many LED lighting applications require heat sinks to dissipate heat from the LEDs. In order to ensure a long service life of LED modules, it is important to lead away the generated heat.

In most applications which combine LEDs with heatsinks, the LED module or modules are mounted on a heat sink, or else they are mounted on a printed circuit board (PCB) which itself is fixed to the heat sink. The LED module or LED PCB is connected to the heat sink through intermediate materials that are in direct contact at their interfaces. For example, solder materials or thermal interface materials bridge the interface avoiding any air gap, in order to facilitate heat transfer from the LED to the heat sink. The generated heat is led to the heat sink through this interface, and then passes to the surroundings for example by fins of the heat sink.

LEDs, and in particular high power LEDs, have a limited lifetime. There may therefore be a need to replace the LEDs. For LED modules directly mounted to a heat sink, this involves replacing the heat sink. For LED modules mounted on a PCB, it may for example involve removing the LED PCB from the heat sink, and replacing the LED PCB as a single component. The LEDs and their PCB may then be considered to be a single unit.

A problem arises that this operation is not straightforward. In particular, the thermal interface material needs to be replaced. This may for example comprise a gel material. The LED replacement then should not be carried out by the public but needs to be conducted by specialists. Contamination of the LED by the thermal interface material will adversely affect the light output and the reliability of the LED in an undesired manner. The alternative of exchanging the LED together with the heat sink results in unacceptably high cost to the customer.

There is therefore a need for an LED module which can easily be changed without the expense of replacing the heat sink. Such need has in part been addressed in the prior art of e.g. WO2012048351A1, JP2011181418A, WO2014083122A1, US20120293652A1, WO2010044011A1, and US20110019409A1 by introducing modular concepts for the heat sink, i.e., mounting the LEDs on a first part of a multi-part heat sink which first part is detachably fastened to the remaining part of the multi-part heat sink. The construction of such multi-part heat sinks, however, leaves further room for improvement.

SUMMARY OF THE INVENTION

According to examples in accordance with an aspect of the invention, there is provided an LED module comprising:

a heat sink portion; and an LED arrangement mounted on the heat sink portion at an LED mounting surface, wherein the heat sink portion constitutes a first part of a multiple part heat sink having at least said first part and a second part, wherein the heat sink portion comprises an outer surface for reception in a corresponding receiving opening of the second heat sink part, and wherein the heat sink portion comprises a conducting carrier embedded within an electrically insulating and thermally conducting surround.

The LED module comprises the combination of an LED arrangement and a portion of a heat sink. The heat sink portion is for example not sufficient to provide the required cooling for the operation of the LED arrangement. Instead, the heat sink portion needs to be coupled to a further heat sink portion in order to provide the overall cooling performance.

In order to change the LED arrangement, the module is changed as a unit. This avoids the need to separate the LED arrangement from the heat sink portion. The coupling between the LED arrangement and the heat sink portion may for example include a thermal interface material. Instead, a user simply disconnects the mechanical coupling between the two heat sink parts. This may for example be a simple push fit coupling, optionally including locking screws.

Preferably, there is no need to provide any material between the two heat sink parts, and there may either be surface contact between the two heat sink parts or an air gap. There is no need for any thermal interface material.

Because the heat sink portion only functions as an interface to the main heat sink (the second part) it has a relatively low cost. It may have a small metal content, only sufficient for electrical connectivity. The heat transfer function only needs to be designed to be sufficient to transfer heat to the rest of the heat sink.

The heat sink portion comprises a conducting carrier embedded within an electrically insulating and thermally conducting surround. The surround facilitates heat transfer from the heat sink portion to the second heat sink part. The conducting carrier may be used to route electrical signals to the LED arrangement.

The electrically insulating and thermally conducting surround may comprise a plastic, which can thus be molded around the conducting carrier.

The conducting carrier may comprise at least two electrically separate portions, wherein the LED arrangement has an anode and a cathode each electrically connected to a respective portion of the conducting carrier. The LED arrangement may for example be mounted over the junction between the conducting carrier portions, with an anode connection (or connections) on one side and a cathode connection (or connections) on the other side.

In order to route electrical signals to the LED arrangement, an electrical connector may be provided which is electrically connected to one or both of the electrically separate portions of the conducting carrier. This connector provides an external connection to the LED arrangement. There may be only one electrical connection if the other terminal is grounded, or else there may be electrical connections to both of the electrically separate portions.

The heat sink portion may comprise a base and a top at which the LED mounting surface is defined, wherein the heat sink portion tapers from the base to the top. This makes the alignment of the heat sink portion into its second heat sink part simple to achieve, as a push fit. The taper acts as a self-alignment feature.

The LED module may comprise a vehicle light module, for example a front light module. There is a periodic need to replace vehicle lights, and this module makes this easier for a customer to carry out.

The invention also provides an LED system, comprising:

an LED module as defined above; and a second heat sink part, wherein the second heat sink part comprises an opening for receiving the heat sink portion of the LED module.

This LED system may be part of a luminaire, for example a vehicle lighting luminaire.

The opening of the second heat sink part may comprise a tapered channel. This corresponds with a tapered heat sink portion of the LED module to implement a self-alignment push coupling.

Preferably, the heat sink part of the LED module and the second heat sink part are in physical contact with each other or are separated only by an air gap when the heat sink portion is received in the opening. This means there is no need for a user to apply a thermal interface material or any other filling material when replacing a module.

An optical component may also be provided for beam shaping of the light output from the LED arrangement. This may for example be used to convert a Lambertian LED output into a desired beam shape, for example for an automobile front light.

The LED module may comprise first connection features and the optical component may comprise second connection features, wherein the first and second connection features are adapted to be connected together with the second heat sink part clamped between.

This means that the connection features define the direct coupling between the LED arrangement and the optical component, so that the optical function is optimized and any manufacturing tolerances relating to the second heat sink part can be neglected, as they do not influence the relative positioning of the LED arrangement and the optical component.

The LED module and the second heat sink part may each comprise a set of fins and air flow channels, wherein the fins and air flow channels of the LED module and of the second heat sink part align when the heat sink portion of the module is received in the opening of the second heat sink part. The two parts thus cooperate to define heat sink fins and channels which function together.

The invention also provides a luminaire comprising an LED system as defined above, wherein the LED module is replaceable by removing it from the opening in the second heat sink part and inserting a new LED module into that opening. This provides an easy replacement operation for a user. The opening in the second heat sink part may be at the back of the heat sink (opposite a light output front face), but the opening may instead be at a side (i.e. perpendicular to the light output front face). Indeed the opening may be at any angle to the front light output face.

The invention also provides a method of replacing an LED module of an LED system as defined above, comprising:

separating the LED module with its heat sink portion from the receiving opening of the second heat sink part; and providing a new LED module by inserting the heat sink portion of the new LED module into the receiving opening of the second heat sink part.

This method is easy to implement for a user, as the LED does not need to be separated from its heat sink portion, but it is also not wasteful as the first heat sink part is only an interface portion rather than a full heat sink.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an LED module which combines a partial heat sink and an LED arrangement. The partial heat sink is a first part of a multiple part heat sink having at least first and second parts. The partial heat sink is not sufficient alone to provide the required cooling for the operation of the LED arrangement so it can be small and low cost. A user can simply replace the module as a single unit, without the significant waste and cost of disposing of the full heat sink.

Figure 1:
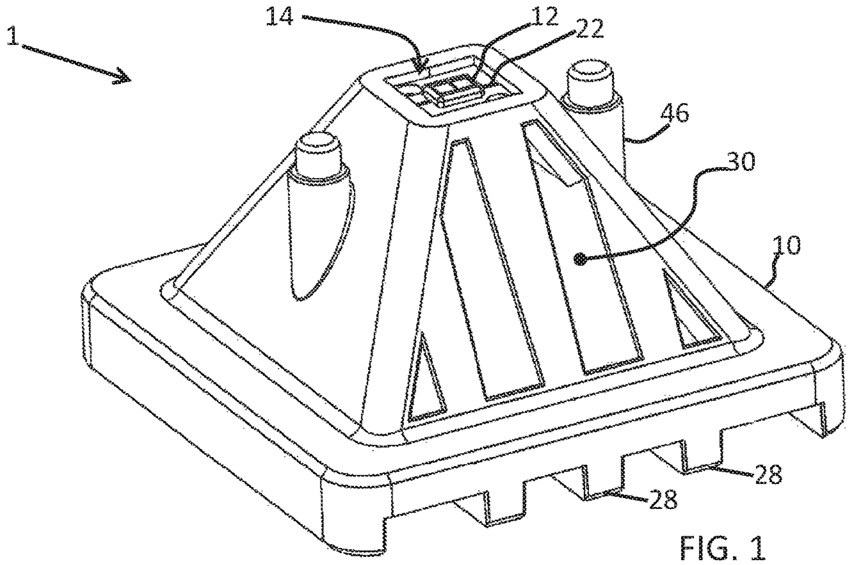
FIG. 1 shows a first view of an LED module.

FIG. 1 shows an LED module 1 which comprises a heat sink portion 10 and an LED arrangement 12 mounted on the heat sink portion 10 at an LED mounting surface 14. The heat sink portion 10 only performs part of the heat dissipation function needed for the LED arrangement 12.

The LED arrangement 12 comprises one or more LEDs, and they are mounted at the top of the heat sink portion 10 on the mounting surface 14.

Figure 2:
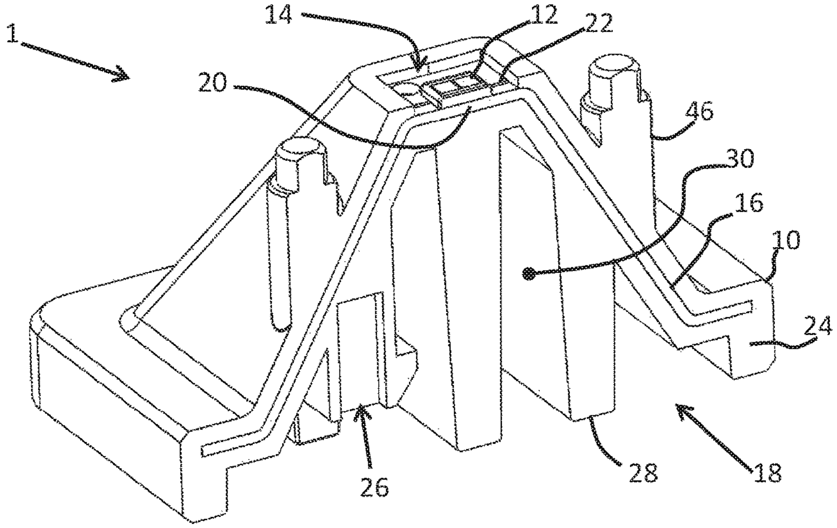
FIG. 2 shows a second view of an LED module.

FIG. 2 shows the LED module 1 of FIG. 1 in cut away view. It shows that the heat sink portion 10 has a shaped sheet metal carrier 16 that forms a 3D shape, which in the example shown is basically a pyramid. The pyramid has a large base 18 so that the shape tapers to the mounting surface 14 at the top, which is defined by a flat region 20 of the carrier 16. The overall shape is thus a truncated pyramid with a flat top.

Other geometries such as cones, cylinders, cubes etc. are equally possible. However, a tapered structure is of particular interest, as it enables simple connection and self-alignment (described below). The top area is then smaller than the base 18, and also lies within the base when perpendicularly projected onto the base.

Other electrically conductive materials may be used for the carrier 16.

The carrier is formed as at least two electrically isolated sections, so that it can define two electrical terminals for connection to the LED arrangement 12. The junction between the two sections is shown as 22. The LED arrangement 12 may then be mounted over the junction 22, with an anode connection (or connections) on one side and a cathode connection (or connections) on the other side.

The LED arrangement 12 may be mounted on the mounting surface 14 as one or more bare dies, or else the LEDs may be mounted on a PCB which is then attached to the mounting surface 14. This attachment may make use of thermal interface materials.

If a metal core PCB is used, the mechanical connection between the PCB and the mounting surface may also provide the required electrical connections. Alternatively, wire-bonds may be provided from the top surface of a PCB down to the mounting surface.

If bare LED dies are used, they may have electrical contacts at their base which directly connect to the isolated sections of the mounting surface.

The LEDs may alternatively be mounted on metal mounts which function as a heat spreader. The connection between the LEDs and their metal mount and the carrier 16 clearly then needs to avoid that the heat spreading metal mount shorts the different isolated sections of the carrier.

Various ways to connect the LED dies or an LED PCB or an LED on a metal mount to the mounting surface will be known to those skilled in the art.

The carrier 16 is surrounded by an electrically insulating heat transfer material surround 24, in the form of a layer such as a thermally conducting plastic or else in the form of multiple layers. The desired thermal conductivity may for example be in the range of 0.2 W/mK to 50 W/mK.

The electrically isolating and thermally conducting surround 24 may be made of a predominately electrically isolating first material such as a thin or thick coating on the conductive carrier 16. This electrically isolating material may then together with the conductive carrier 16 be embedded in a predominantly thermally conducting second material. In this way, the two functions of the surround, namely electrical isolation and thermal conductance, are achieved by two separate materials.

Optionally, the thermally conducting material (or the multiple layer structure) may be surrounded by a further heat conductive material, which can then be electrically conducting, such as a metal layer. This may be used to improve the thermal coupling of the module 1 to a second heat sink part (described below). The further heat conductive layer may then also perform an electrical shielding function. The further heat conductive material may for example be provided only at the surfaces of the module which will conduct heat to the second heat sink part.

It will be seen that the surround 24 may be a single layer, a pair of layers (to separate the thermal and electrical requirements), or even three or more layers. All of these possibilities are within the scope of the invention.

The heat transfer surround 24 covers the carrier 16, for example so that the bottom plane is kept free of metal. The material layer or layers are is preferably molded around the carrier.

In order to route electrical signals to the LED arrangement, an electrical connector 26 is provided which makes electrical contact with the multiple sections of the carrier 16. The conducting parts of the connector 26 may be a part of the carrier 16 so that the carrier 16 and its molded covering 24 define the connector 26. Alternatively, the connector may be a separate component, which is electrically connected to the sections of the carrier 16 by wires or other contacts. The connector 26 provides a detachable external electrical connection to the LED arrangement 12.

The connector 16 is shown positioned within the outer envelope of the module 1, so that it defines a connector 26 which is recessed within the heat sink portion 10. This provides a space saving improvement.

The base 18 of the heat sink portion 10 has heat dissipation fins 28 and in the example shown there are also air flow channels 30 which extend through the heat sink portion 10. These may pass through holes in the sheet metal carrier 16 or even complete sides of the module 1 may be made without the sheet metal carrier 16.

Figure 3:
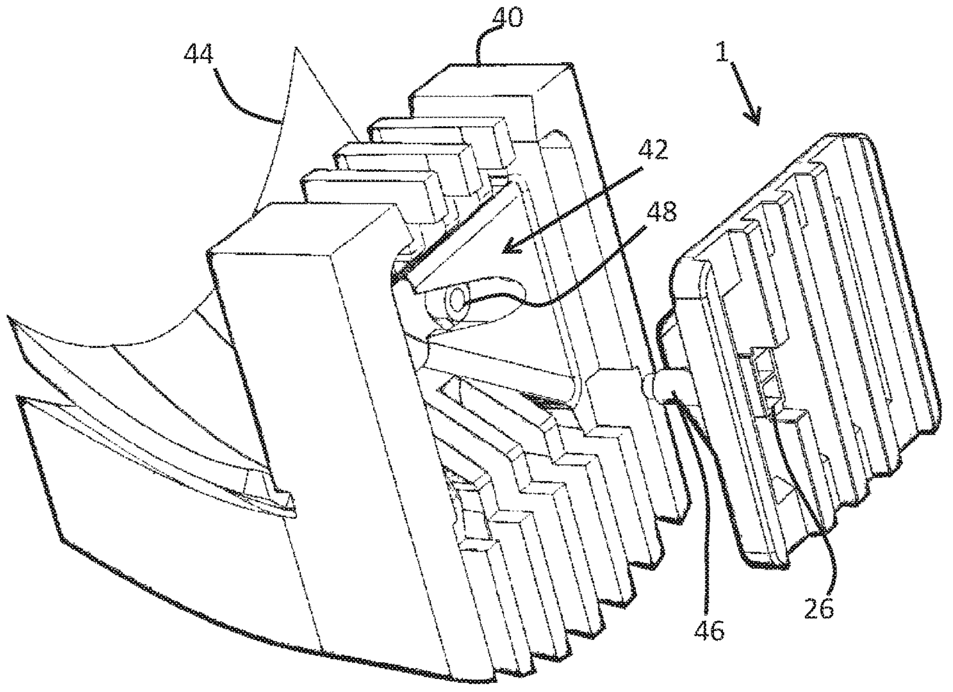
FIG. 3 shows in perspective view of an LED system comprising the LED module of FIGS. 1 and 2 together with a second heat sink part and a beam shaping component.

FIG. 3 shows an LED system comprising the LED module 1 as described above and a second heat sink part 40. The second heat sink part 40 has an opening 42 for receiving the heat sink portion 10 of the LED module 1. This functions as a negative into which the module 1 is received.

The second heat sink portion 40 has fins and channels. The fins and channels of the two heat sink parts 10 and 40 cooperate to form a ventilation system that carries away heat from the LED by a chimney effect.

The opening 42 thus comprises a tapered channel with a shape which corresponds with the shape of the heat sink portion 10 of the LED module 1. The module 1 is a push fit into the opening 42, and the taper implements a self-alignment function.

The opening 42 extends through the second heat sink part 40 so that when the module 1 is inserted, the mounting surface 14 is exposed and the LED arrangement 12 provides a light output. A beam shaping optical component 44 is used for beam shaping of the light output from the LED arrangement 12. This may for example be used to convert the Lambertian LED output into a desired beam shape, for example for an automobile front light.

In order to fix the module 1 to the second heat sink part 40, the module 1 has connection features 46 in the form of guide rods and the optical component 44 has corresponding second connection features 48 in the form of threaded bores. The first and second connection features are connected together by inserting screws into the guide rods which then engage with the threaded bores. These may enable relative positional adjustment or else they may simply clamp the parts together in one fixed positional relationship. The module 1 and the optical component 44 are then clamped together with the second heat sink part 40 sandwiched between.

A snap fit connection may instead be used, avoiding the need for screws or other separate connection parts.

This means that the connection is between the LED arrangement 12 and the optical component 44, so that the optical function is optimized and any manufacturing tolerances arising from the second heat sink part 40 can be neglected.

The heat sink portion 10 of the module 1 only functions as an interface to the main heat sink (the second part 40). It can therefore be made with low cost.

The module 1 is inserted into and removed from the overall light system from the outside, in a similar manner to a conventional light bulb.

Although not shown, a removable water-tight cover may be mounted over the outside of the system at the location where the module 1 is inserted.

The thickness of the second heat sink part 40 at the opening 42 may be smaller than the module height, so that the LED arrangement 12 projects beyond the second heat sink part 40 into the cavity forming part of the optical component 44. The second heat sink part 40 then does not cut away any part of the light output. Alternatively, the second heat sink part 40 may be designed to implement part of the overall desired optical function.

The heat sink portion 10 of the module 1 may be a contact fit into the opening 42 or else an air gap may be defined between the two. An air gap for example allows some adjustment to align the connection features 46, 48, as well as to compensate for positioning and manufacturing tolerances of all involved parts. An air gap between LED module 1 and the second heat sink 40 part also allows some circulation of air around the module by thermal convection. This heated air may for example be routed to de-frost an exterior cover of the lighting system.

Figure 4:
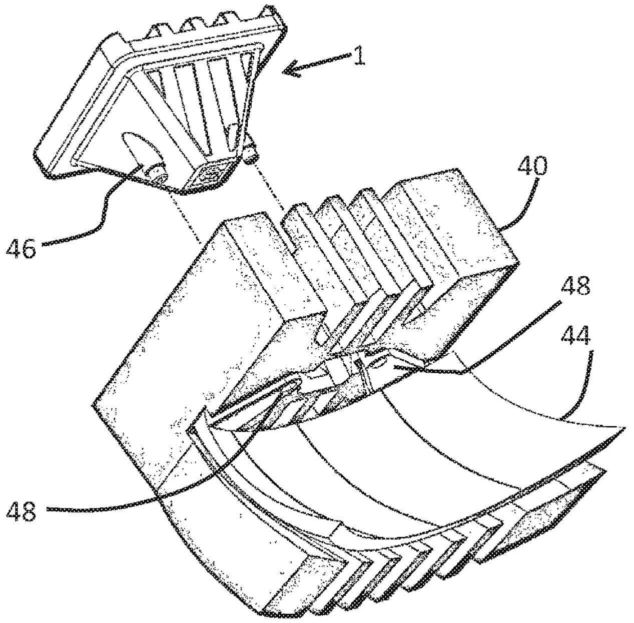
FIG. 4 shows another view of the system of FIG. 3.

FIG. 4 shows the system of FIG. 3 from the front and it shows more clearly the optical component 44 and the second connection features 48.

Figure 5:
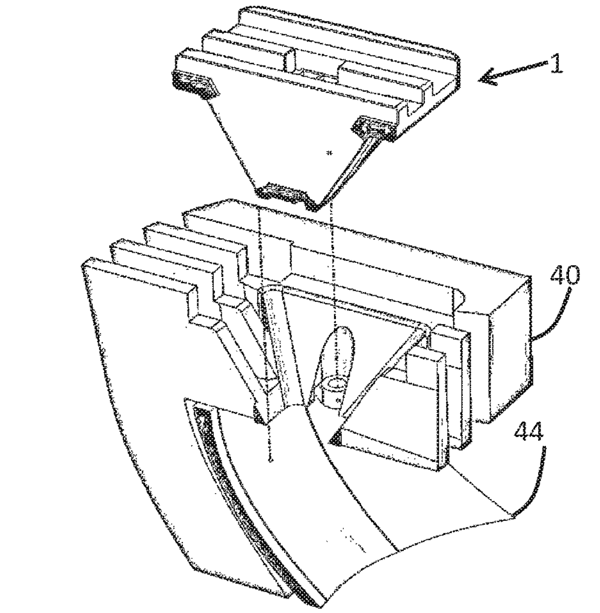
FIG. 5 shows another view, in cut-away form, of the system of FIG. 3.

FIG. 5 shows the system of FIG. 3 in cut away view and it shows more clearly how the fins and channels of the heat sink portion of the module 1 align with the fins and channels of the second heat sink part 40 so that they together form a heat sink with the required thermal properties.

Only one example of connection arrangement between the heat sink portion 10 and the optical arrangement 44 has been shown above. Alternative alignment features may be provided, such as holes or pins that are incorporated at the mounting surface 14 next to the LED arrangement 12, with which the optics can engage.

The inside of the module 1 may include additional driver electronics for controlling the light output of the LED, or else all the driver electronics may be remote to the unit.

The example above has the LED arrangement 12 mounted on a flat face, projecting light in a normal direction (perpendicular to the general plane of the heat sink i.e. the plane of the base 18). The LED arrangement 12 may instead be mounted on a surface which is offset from the plane of the base 18. For example, sideways light emission of the LED may be achieved by mounting the LED arrangement 12 perpendicular to the base, for example on a projecting fin. The LED arrangement 12 may be mounted at any desired angle to enable light emission at any pre-defined angle.

The example above has the LED mounted on the top of the module 1, in particular at a flat top. The LEDs may instead be mounted on one or more of the tapered side walls. The purpose of the taper is to enable easy fitting. The LED may be at any location as long as, when the heat sink portion 10 is fitted to the second heat sink part 40, the LED light is able to be output as required. There may be LEDs at multiple locations on the heat sink portion 10, for example on the top as well as on the tapered side faces.

To protect the LED a protective cover may be provided at the top of the module 1 so that the LED arrangement 12 is not exposed at the top of the module 1. The LED arrangement 12 may instead be embedded in a protective cover such as a resin. This may be shaped to serve as pre-optics for the LED arrangement 12.

The side of the LED arrangement 12 may be covered by a reflective side coating to prevent side emission from the LED arrangement 12. Alternately, the heat conductive material 24 may be shaped to the side of the LED to serve as a reflective material. The sheet metal carrier 16 at top of the LED module 1 may be almost completely covered by the heat conductive material.

In order to replace the LED module 1, the module 1 is simply separated from the receiving opening 42 of the second heat sink part 40 (either by releasing a snap fit connection or undoing screws) and providing a new LED module 1 by inserting the heat sink portion 10 of the new LED module 1 into the receiving opening 42 of the second heat sink part 40. There may be keying features to make this insertion operation as easy as possible and to ensure correct orientation of the two parts.

This method is easy to implement for a user, as the LED does not need to be separated from the heat sink portion 10, but it is also not wasteful as the heat sink portion 10 is only an interface portion rather than a full heat sink.

The LED module may comprise a vehicle light module such as a front light module. There is a periodic need to replace vehicle lights, and this module makes this easier for a customer to carry out.

The module 1 will have a size which is selected to enable easy manipulation by a user. Its size will depend on the optical power of the light source carried by the module. It will have a size which enables suitable heat management of the heat created by the LED so that this heat can be passed to the main heat sink part. This imposes a minimum size. The size should also be kept low to avoid waste, as the module 1 is discarded when the LED arrangement has failed.

By way of example, for a module 1 in the shape of a square-based pyramid as shown, the square base may be 35 mm×35 mm for a relatively low power LED arrangement 12 and 50 mm×50 mm for a relatively high power LED arrangement 12. The area of the base thus may be in the range 400 $mm^2$ to 4000 $mm^2$. The second heat sink part 40 will have a larger base area, for example at least 2×, or even at least 5× the area of the base of the module.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An LED module comprising:

a heat sink portion; and an LED arrangement mounted on the heat sink portion at an LED mounting surface, wherein the heat sink portion is designed for constituting a first part of a multiple part heat sink having at least said first part and a second part, wherein the heat sink portion comprises an outer surface being designed for reception in a corresponding receiving opening of the second heat sink part, and wherein the heat sink portion comprises an electrically conducting carrier embedded within an electrically insulating and thermally conducting surround.

2. An LED module as claimed in claim 1, wherein the electrically insulating and thermally conducting surround comprises a plastic.

3. An LED module as claimed in claim 1, wherein the conducting carrier comprises at least two electrically separate portions, wherein the LED arrangement has an anode and a cathode each electrically connected to a respective portion of the conducting carrier.

4. An LED module as claimed in claim 3, wherein the LED arrangement is mounted over a junction between the at least two electrically separate portions.

5. An LED module as claimed in claim 3, comprising an electrical connector which is electrically connected to one or both of the at least two electrically separate portions of the conducting carrier.

6. An LED module as claimed in claim 1, wherein the heat sink portion comprises a base and a top at which the LED mounting surface is defined, wherein the heat sink portion tapers from the base to the top.

7. An LED module as claimed in claim 1, comprising a vehicle lighting module.

8. An LED system, comprising:

an LED module as claimed in claim 1; and the second heat sink part of the multiple part heat sink of which the heat sink portion constitutes the first part.

9. An LED system as claimed in claim 8, wherein the opening of the second heat sink part comprises a tapered channel.

10. An LED system as claimed in claim 8, wherein the heat sink portion of the LED module and the second heat sink part are in physical contact with each other or are separated only by an air gap when the heat sink portion is received in the opening.

11. An LED system as claimed in claim 8 and further comprising an optical component, wherein the LED module comprises first connection features and the optical component comprises second connection features, wherein the first and second connection features are adapted to be connected together.

12. An LED system as claimed in claim 8, wherein the LED module and the second heat sink part each comprise a set of fins and air flow channels, wherein the fins and air flow channels of the LED module and of the second heat sink part align when the heat sink portion of the LED module is received in the opening of the second heat sink part.

13. A luminaire comprising an LED system as claimed in claim 8, wherein the LED module is replaceable.

14. A method of replacing an LED module of an LED system as claimed in claim 8, comprising:

separating the LED module with its heat sink portion from the receiving opening of the second heat sink part; and providing a new LED module by inserting the heat sink portion of the new LED module into the receiving opening of the second heat sink part.

* * * * *